(12) United States Patent
Beukema et al.

(10) Patent No.: US 8,139,700 B2
(45) Date of Patent: Mar. 20, 2012

(54) DYNAMIC QUADRATURE CLOCK CORRECTION FOR A PHASE ROTATOR SYSTEM

(75) Inventors: Troy J. Beukema, Yorktown Heights, NY (US); Steven M. Clements, Research Triangle Park, NC (US); Chun-Ming Hsu, Hopewell Junction, NY (US); William R. Kelly, Hopewell Junction, NY (US); Elizabeth M. May, Research Triangle Park, NC (US); Sergey V. Rylov, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 441 days.

(21) Appl. No.: 12/492,419

(22) Filed: Jun. 26, 2009

(65) Prior Publication Data
US 2010/0329403 A1    Dec. 30, 2010

(51) Int. Cl.
*H04L 25/00* (2006.01)
(52) U.S. Cl. ......... 375/371; 375/376; 327/147; 327/153
(58) Field of Classification Search ............. 375/371, 375/373, 375, 376; 327/144, 146, 147, 152, 327/153; 710/305; 713/500, 600
See application file for complete search history.

(56) References Cited

U.S. PATENT DOCUMENTS

| | | | | |
|---|---|---|---|---|
| 4,977,580 | A * | 12/1990 | McNicol | 375/344 |
| 6,586,977 | B2 * | 7/2003 | Yang et al. | 327/157 |
| 6,683,921 | B1 * | 1/2004 | Shiraishi et al. | 375/331 |
| 2009/0289672 | A1 * | 11/2009 | Hua et al. | 327/147 |

OTHER PUBLICATIONS

Yamguchi, K., et al. 2.5GHZ 4-Phase Clock Generator With Scalable and No Feedback Loop Architecture. 2001 IEEE International Solid-State Circuits Conference. Feb. 2001. (3 pages).

* cited by examiner

*Primary Examiner* — Dac Ha
(74) *Attorney, Agent, or Firm* — Tutunjian & Bitetto, P.C.; Anne V. Dougherty, Esq.

(57) ABSTRACT

A system and method for closed loop clock correction includes adjusting two or more input signals comprising at least one in-phase clock and one quadrature clock, and applying adjusted quadrature clock signals to a device capable of generating a 4-quadrant interpolated output clock phase. An interpolated output clock phase is delayed to form a clock for a measurement device. Two or more adjusted input signals are measured on a measurement device over a range of interpolated output clock phases. Errors are determined on the in-phase clock and the quadrature clock using sampled information from the measurement device. The in-phase clock and the quadrature clock are adapted using determined error information.

24 Claims, 7 Drawing Sheets

DYNAMIC QUADRATURE CLOCK CORRECTION FOR A PHASE ROTATOR SYSTEM

BACKGROUND

1. Technical Field

The present invention relates to a system and method for automatically correcting duty cycle, quadrature relationship, and amplitude relationship between two reference clocks in a closed loop phase rotator sub-system, which may be embodied on an integrated circuit.

2. Description of the Related Art

A common clock generation architecture employed in high data-rate serializer-deserializer (SERDES) input/output (I/O) cores employs a single low-noise phase locked loop (PLL). The PLL signal is distributed to one or more of a transmitter (Tx), a receiver (Rx), or a transceiver subsystem which includes "phase rotators" to frequency and phase offset the fixed-frequency PLL clock so that the local receiver clock can be phase-locked to an incoming data stream.

Referring to FIG. 1, a block diagram of a clock-generation subsystem is shown. In this example, a PLL 10 output clock is divided by two using a quadrature divider 12. The quadrature divider 12 produces output "In-phase" (I) 13 and "Quadrature-phase" (Q) 14 clocks, each divided by two from the PLL clock frequency and shifted from each other by 90 degrees. These quadrature clocks 13 and 14 are distributed to one or more data I/O cores 15. Each I/O normally contains a local clock buffer 16 which may be used to improve the quadrature accuracy and/or duty cycle of the I and Q clocks 13 and 14, respectively before being applied to local phase rotators 17 and 18.

This local clock buffer is implemented using open-loop methods, meaning that the clock signals pass through the buffers 16 without any feedback correction applied to improve the output duty cycle and/or quadrature relationship of the clocks. Other devices may include latches 21.

The clocks 13 and 14 are shown being distributed to a number of data receivers 15 for illustrative purposes. Each receiver 15 can have an independent input data stream (e.g., Data Input 1) which must be frequency and phase locked by the local clock-and-data recovery (CDR) unit 22. In a typical application, to achieve frequency and phase lock, the CDR 22 updates the phase of the local edge phase rotator 17 such that an edge crossing from the output of edge rotator 17 is coincident with the edge crossing of the incoming data stream (Data Input 1). Data rotator 18 is programmed to a phase offset suitable for data detection, normally ½ bit interval, shifted from the edge rotator 17. Latches 21 are used to capture the data and edge information which is processed by CDR unit 22. It is understood that the basic data and edge detection receiver is sufficient for illustration purposes of the phase rotator based clock generation system.

The phase rotators 17, 18 are capable of generating an output clock 19 and 8 with phase varying from 0 to 360 degrees by mixing and combining the I and Q input clocks with varying weights as shown in FIG. 2.

Referring to FIG. 2, the phase rotator 17, 18 works by summing a weighted combination of input quadrature clocks 23 and 24 to create an output clock 30 with programmable phase. As an example, a digital analog converter (DAC) 26 outputs weights 27 and 28. When an I clock digital analog converter (IDAC) 27 weight inputs to an I clock mixer 25 and is set to 1 (meaning 100% selected) and a Q clock DAC (QDAC) 28 weight is set to 0 (meaning 0% selected), the phase rotator 17, 18 outputs the I clock, which by definition has a 0 degree phase. Similarly, when the Q clock DAC 28 weight is set to I and the I clock DAC 27 weight is set to 0, the phase rotator outputs the Q clock, which has a 90 degree phase if and only if the input Q clock 24 is in perfect quadrature with the I clock. Intermediate phases can be achieved by weighting the I and Q clocks with corresponding multipliers which achieve the desired output phase as shown in table 33 in FIG. 2.

A common implementation of a phase rotator in a serializer/deserializer core using ½ rate clocking (meaning the I and Q clock frequencies are ½ of the received data rate) employs a total of 64 phase steps from 0 to 360 degrees, achieving a phase resolution of 5.625 degrees. Such a design provides a time resolution of 32 steps across one received data bit duration. Although the detailed circuit implementation of the phase rotator components (DACs 27 and 28, mixers 25, and summer 29 can use many different techniques, every phase rotator implementation will be limited in phase accuracy by the fundamental accuracy of the I and Q input clocks 23 and 24.

Since the I and Q clocks are distributed from an LC PLL to many Tx/Rx cores, the quadrature relationship of the clocks can become mismatched due to different I/Q path delays in the clock distribution. Further, the duty cycle of the clocks can become inaccurate due to mismatch and delay differences in clock buffer devices.

Referring to FIG. 3, a timing diagram illustrates quadrature clocks. The clock waveform crossing times T1, T2, T3 and T4 can be related to the resulting duty cycle and quadrature relationship error through the following definitions and formulas:

$$T = \text{average clock ½ period} = T4/2 \quad (1)$$

$$\text{DUTY}I = T2/(2*T)*100\% \quad (2)$$

$$\text{DUTY}Q = (T3-T1)/(2*T)*100\% \quad (3)$$

$$IQ = \text{integ}(I*Q) = (T3-T2+T1)/T*90 \text{ deg} \quad (4)$$

A perfect IQ clock has DUTYI=50%, DUTYQ=50%, and IQ=90 degrees, meaning the I and Q clock + and − polarity duration are identical, and the Q clock is delayed from the I clock by exactly 90 degrees, which corresponds to ¼ of the full clock period 2*T. To see how non-50% duty cycle and non-90 degree quadrature can translate to time jitter in the clock generator, the values T1, T2, T3 and T4 can be expressed as a function of the duty cycle and quadrature relationship as follows;

$$T1 = (IQ/180 \text{ deg} + (\text{DUTY}I - \text{DUTY}Q)/100\%)*T \quad (5)$$

$$T2 = \text{DUTY}I/50\%*T \quad (6)$$

$$T3 = T1 + \text{DUTY}Q/50\%*T \quad (7)$$

$$T4 = 2*T \quad (8)$$

To simplify the jitter analysis, it can be assumed that the phase rotator creates an edge clock from either the I or Q signal and a data clock from the Q or I signal, respectively, at the clock crossing intervals 0, T1, T2, T3, and T4 in FIG. 3. Since the edge clock sets the time reference for the sampling system, the data clock jitter can be computed as the difference from an ideal sampling position (T/2 delayed from the edge clock in this description) to the actual sampling position (T/2 delayed+error).

In an asynchronous clock-recovery system, the edge phase will shift from 0 to T4 over time as the receiver system tracks an incoming data signal with a non-coherent (different frequency than local PLL) clock. Therefore, at the waveform crossing intervals, the possible edge and data sampling positions are given as shown in Table 1:

TABLE 1

Data Sample Jitter

| Edge Sample | Data Sample | Data Sample Jitter |
|---|---|---|
| 0 | T1 | (T1 - T/2) |
| T1 | T2 | (T2-T1 - T/2) |
| T2 | T3 | (T3-T2 - T/2) |
| T3 | T4 | (T4-T3 - T/2) |

The peak-to-peak data sample jitter added by the non-ideal quadrature clocks can be expressed as the maximum of the sample jitter in Table 1 minus the minimum of the sample jitter, which can be compactly computed as:

$$\text{Data Sample Jitter} = \max(T1, T2-T1, T3-T2, T4-T3) - \min(T1, T2-T1, T3-T2, T4-T3) \quad (9)$$

The jitter is zero only when T1, and the separation between T2 and T1, T3 and T2, and T4 and T3 all equal T/2. This condition can happen only if the I and Q clocks are in perfect quadrature (Q delayed from 1 by T/2) and have a 50% duty cycle.

In the prior art, a local open-loop "coarse clean up" buffer 16 (FIG. 1) at each local clock generator is commonly employed to clean up the IQ clocks as much as possible for quadrature accuracy and duty cycle before the signals are applied to the phase rotator.

Referring to FIG. 4, a common implementation of a "coarse clean up" buffer in the prior art is shown which provides two output paths which form I+Q and Q−I from summers 40 with two current-mode-logic (CML) clock inputs I and Q augmented with DC-blocking clock buffers 41 on the output to improve the duty cycle. This operation improves the quadrature relationship and duty cycle of the output clock signals. However, limitations in match accuracy in the "coarse clean up" buffer itself due to variations in the devices used to build it puts a fundamental limitation on the achievable accuracy. In particular, load resistances 42, device gains 43, and buffer stage bias currents 44 are all susceptible to significant mismatch effects when realized in deep-submicron CMOS technology. These mismatch effects effectively create unwanted DC offset on the outputs which add error to the duty cycle and quadrature relationship of the I and Q clocks.

Studies of realized integrated circuits indicate that even after a "coarse clean-up" buffer and any associated open-loop duty-cycle clean-up clock buffers, the reference clock errors arising from device mismatches can induce a data sample time jitter as predicted by formula (9) on the order of 20% of a received bit width (which is equal to the time interval T in a half-rate clocking architecture) or more. This level of degradation is typically not acceptable for applications in high data rate (5-10 Gb/s and beyond) SERDES since time jitter of 20% is not available in the jitter budgets due to large jitter from crosstalk, reflections, inter-symbol interference (ISI), and other core degradation sources including random clock jitter from the PLL. In many common data transmission applications, channel and core induced jitter will result in 15% or less remaining jitter margin within a one bit-interval sample interval even with a perfectly linear phase generation subsystem. In addition to mismatch issues open-loop systems are unable to truly compensate I/Q separation error effects due to the basic I+Q/Q−I algorithm, which simply propagates this error from time to amplitude domain where it still negatively affects rotator accuracy.

SUMMARY

A system and method for clock correction includes adjusting two or more input signals comprising at least one in-phase clock and one quadrature clock, and applying adjusted quadrature clock signals to a device capable of generating a 4-quadrant interpolated output clock phase. An interpolated output clock phase is delayed to form a clock for a measurement device. Two or more adjusted input signals are measured on a measurement device over a range of interpolated output clock phases. Errors are determined on the in-phase clock and the quadrature clock using sampled information from the measurement device. The in-phase clock and the quadrature clock are adapted using determined error information.

A method for dynamically correcting a clock in a closed loop quadrature clock phase generation system includes receiving two or more input signals comprising in-phase and quadrature clocks; adjusting the in-phase clock and the quadrature clock for at least one of quadrature, duty cycle, and amplitude; applying adjusted quadrature clock signals to a rotator capable of generating a 4-quadrant interpolated output clock phase; delaying an interpolated output clock phase to form a clock for a measurement device; measuring two or more adjusted input signals including the in-phase and quadrature clocks over a range of interpolated output clock phases in the measurement device; determining error information including duty cycle error, quadrature error, and amplitude error on the in-phase and quadrature clocks using sampled information from the measurement device; and adapting the quadrature, duty cycle, and amplitude adjustments on the in-phase and quadrature clocks using the error information in a closed loop feedback configuration.

An apparatus for adapting a closed loop clock correction control system in a quadrature clock phase generation system includes a clock correction device configured to receive two or more input signals comprising in-phase and quadrature clocks, the clock correction device configured to adjust the in-phase and quadrature clocks in accordance with closed loop feedback from a control module which provides for correction of at least one of quadrature, duty cycle, and amplitude. A rotator is coupled to the clock correction device and configured to adjust quadrature clock signals to generate a 4-quadrant interpolated output clock phase. A delay is coupled to the rotator to receive the interpolated output clock phase to form a clock for a measurement device. The measurement device receives adjusted in-phase and quadrature clocks over a range of interpolated output clock phases to determine duty cycle error, quadrature error, and amplitude error on the in-phase and quadrature clocks using sampled information. The control module is configured to receive an output of the measurement device and adapt the quadrature error, duty cycle error, and amplitude error to provide adjustments to the in-phase and quadrature clocks at the clock correction device using error information.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
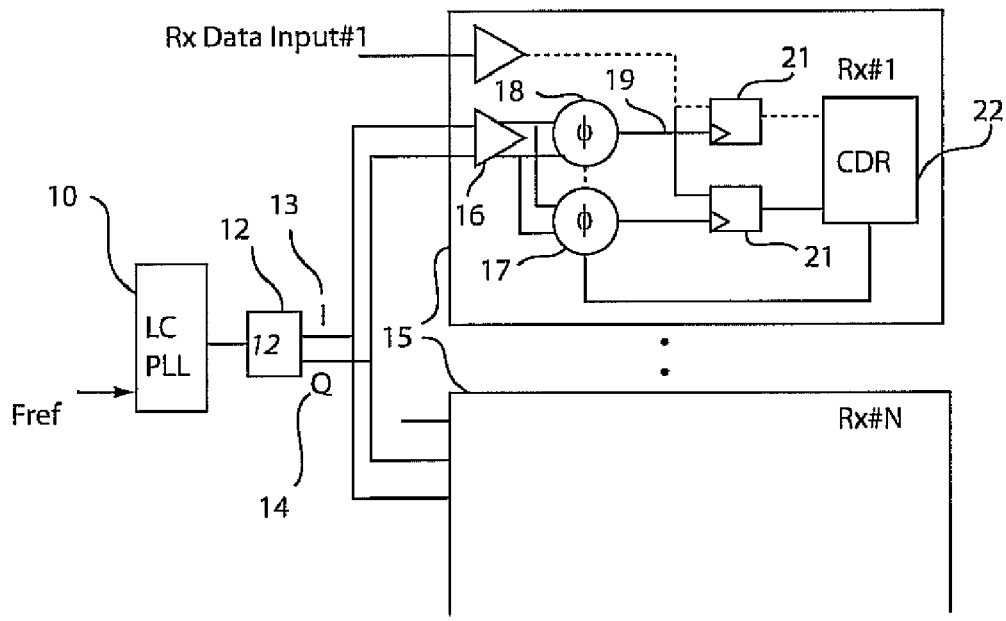
FIG. 1 is a block diagram showing a phase rotator based clock generation system in accordance with the prior art.
Figure 2:
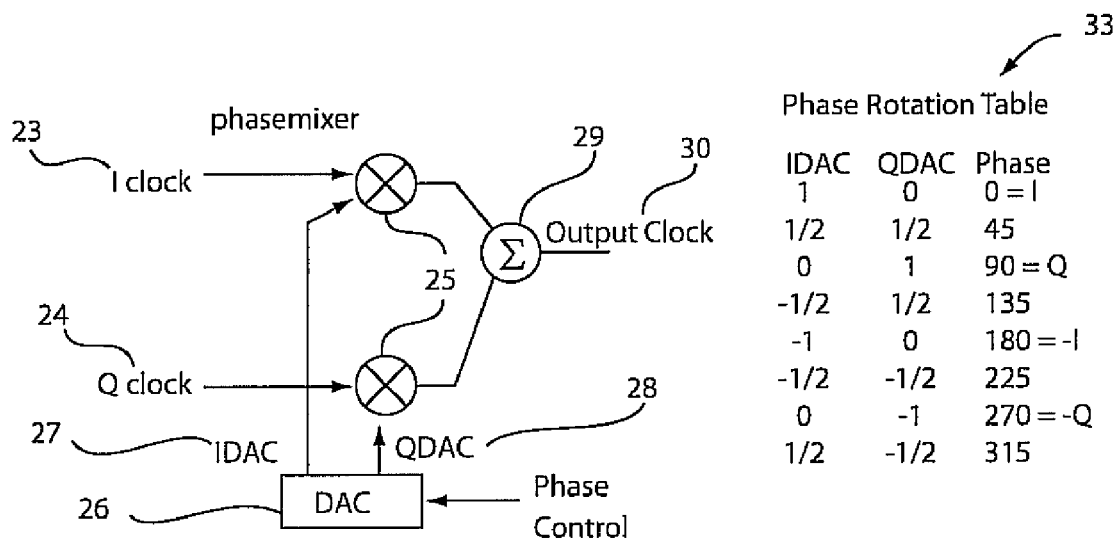
FIG. 2 is a block diagram showing a phase rotator and phase rotation table in accordance with the prior art.
Figure 3:
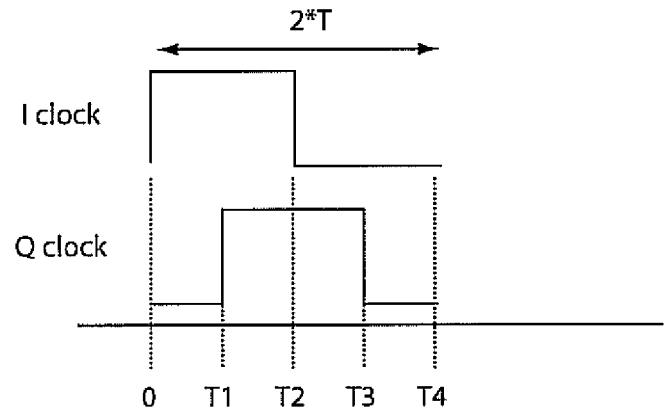
FIG. 3 is a timing diagram showing I and Q clock waveforms for demonstrative purposes.

The present principles address both static mismatch and voltage/temperature induced drift errors which can occur in clock paths of data input and output systems and methods. The present principles improve the linearity of phase generator subsystems to a level better than the achievable performance of prior-art open-loop correctors. The present embodiments correct clock errors which arise due to process, voltage, and temperature variations dynamically with low power and chip area overhead to a system. The present embodiments solve the problem of achieving perfect quadrature over process, voltage and temperature (PVT) variations which open-loop schemes do not achieve perfectly even if device matches (P) were perfect, and in particular over a range of operating data rates. Reduced reference clock errors directly result in smaller clock jitter in a clock phase generation subsystem. Smaller clock jitter, in turn, translates to improved operating margin for applications such as high speed serial I/O interconnects.

These principles may be applied to any application which needs accurate quadrature reference clocks or accurate duty-cycle clocks, including transmitter and receiver systems in serializer/deserializer (SERDES), I/O cores, quadrature mixer sub-systems commonly employed in radios, SERDES clock phase generation, IQ mixers, closed loop transmission duty cycle correction systems, closed loop receiver latch duty cycle correction systems, etc.

The present principles move away from open-loop quadrature and duty cycle correction to a novel closed-loop/adapted method for an IQ interpolation based phase generator. The device mismatch in the IC technology is not good enough to provide sufficient performance when using open loop correction schemes.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

A circuit as described herein may be part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., Graphic Data System II (GD-SII)) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 5:
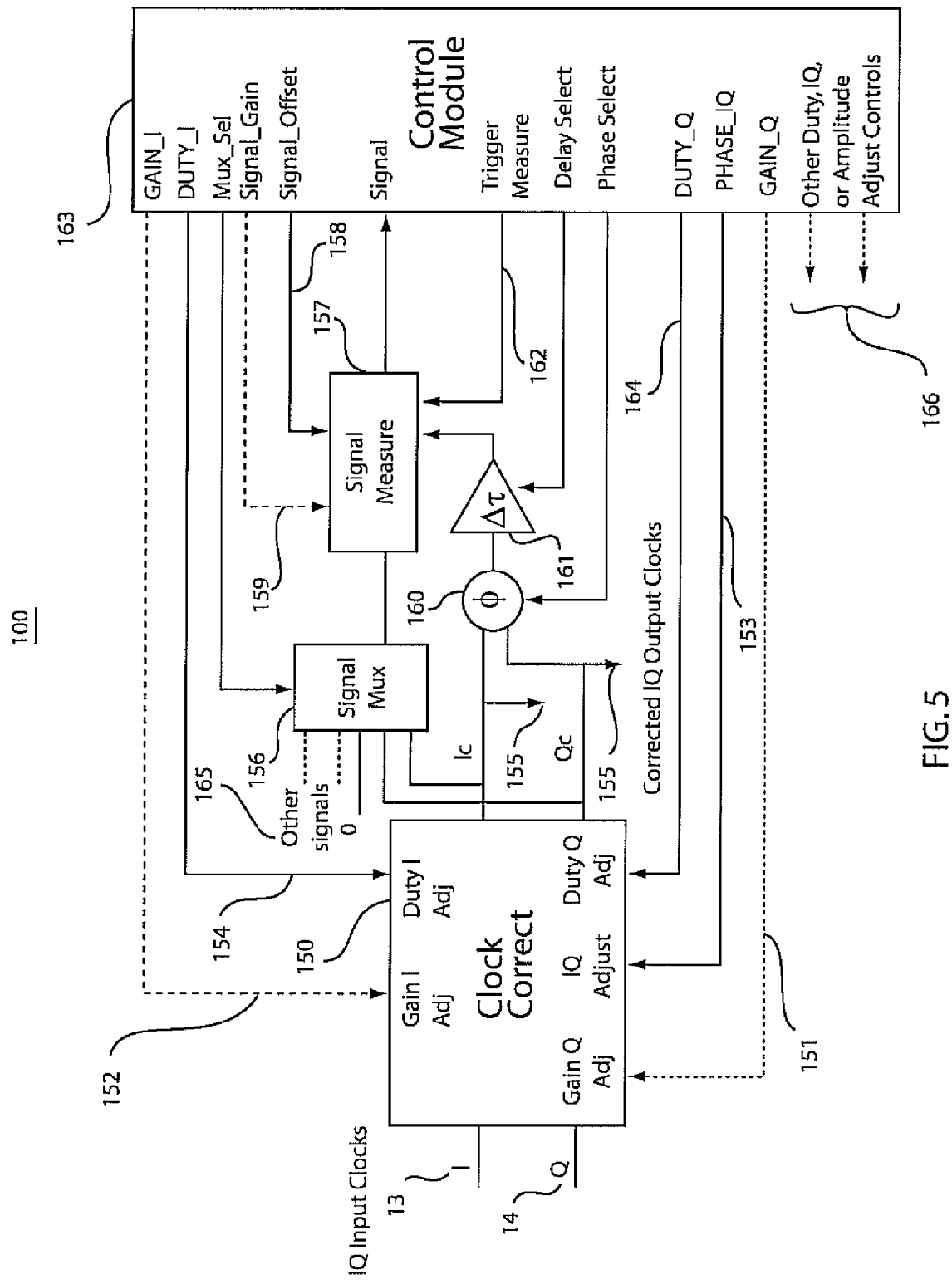
FIG. 5 is a block diagram showing a closed-loop dynamic clock correction system in accordance with one illustrative embodiment.

Referring now to the drawings in which like numerals represent the same or similar elements and initially to FIG. 5, a closed-loop dynamic clock correction system 100 is shown in the high level block diagram. The dynamic clock correction system 100 digitally measures I and Q clock duty cycle/phase relationships and corrects both quadrature accuracy and duty cycle of the clocks using a continuously adapted control loop. In addition, the system 100 has the ability to balance the I and Q clock amplitudes which can adversely impact the phase linearity achieved in the phase rotator if they become imbalanced. In so doing, the system 100 compensates mismatch effects in clock distribution circuitry to enable reduced data sample clock jitter which can arise from quadrature error, duty cycle error, and/or amplitude mismatch on the IQ clocks driving the phase rotator.

The illustrative system 100 accepts quadrature clocks I clock 13 and Q clock 14 and adjusts the quadrature relationship, duty cycle, and optionally amplitude of these clocks using quadrature clock adjust device or stage 150 to produce corrected output clocks Ic and Qc 155. The corrected clocks from clock adjust stage 150 are routed to a phase rotator device 160 and a signal multiplexer device 156 which passes either the corrected I clock, Q clock, "0" (clock baseline reference), or optionally other signals to the input of a signal measurement block or device 157.

Signal measurement block 157, in one embodiment, conditions offset 158 and optionally gain 159 of the input signal and produces a digital output measurement (Signal) of the input signal. The signal measurement (157) is sampled using a clock generated by phase rotator device 160 which in turn is delayed by a delay element 161. In one embodiment, the delay element 161 may be programmed over a range of different delays.

A control module 163 generates a measurement trigger 162 to produce a signal measurement in signal measurement block 157. The signal measurement result is processed by control module 163 to generate updated clock correction inputs to clock adjust module 150 including PHASE_IQ control 153 to correct clock quadrature error, DUTY_I control 154 to correct duty cycle error on the I clock, DUTY_Q control 164 to correct duty cycle error on the Q clock, and GAIN_I 152 and/or GAIN_Q 151 controls to correct gain errors on the I or Q clocks, respectively.

Control module 163 sequences rotator 160 phase, delay element 161 delay, and measurement sample trigger control 162 using a control method which achieves detection and correction of the input quadrature clock duty cycle errors, quadrature errors, and optionally gain errors. Control module 163 may optionally be used to detect and correct errors in other clocks in a system embodiment by routing other signals 165 through the signal multiplexer 156 and controlling associated duty cycle, gain, or quadrature relationship of these other signals using appropriate controls 166.

In a simple embodiment, no other signals are measured or controlled, and the corrected I and Q clocks 155 may be sent to data and edge phase rotator inputs 17 and 18 (FIG. 1) to generate interpolated clock phases with improved phase linearity in a data receiver system.

A clock correction method implemented by control module 163 may measure the sign of the Ic and Qc clocks over their full period, corresponding to a time duration of 2*T or 360 degrees of phase. To determine quadrature error, the control method accumulates the product integration of the sign of the Ic and Qc waveforms while stepping the rotator 160 phase across the 2*T time period in discrete steps. To determine duty cycle error, the method accumulates the integration of the Ic and Qc waveform signs over the same 2*T period. The procedure used in one embodiment to determine these error integrations is described by the following error measurement control method.

Figure 6:
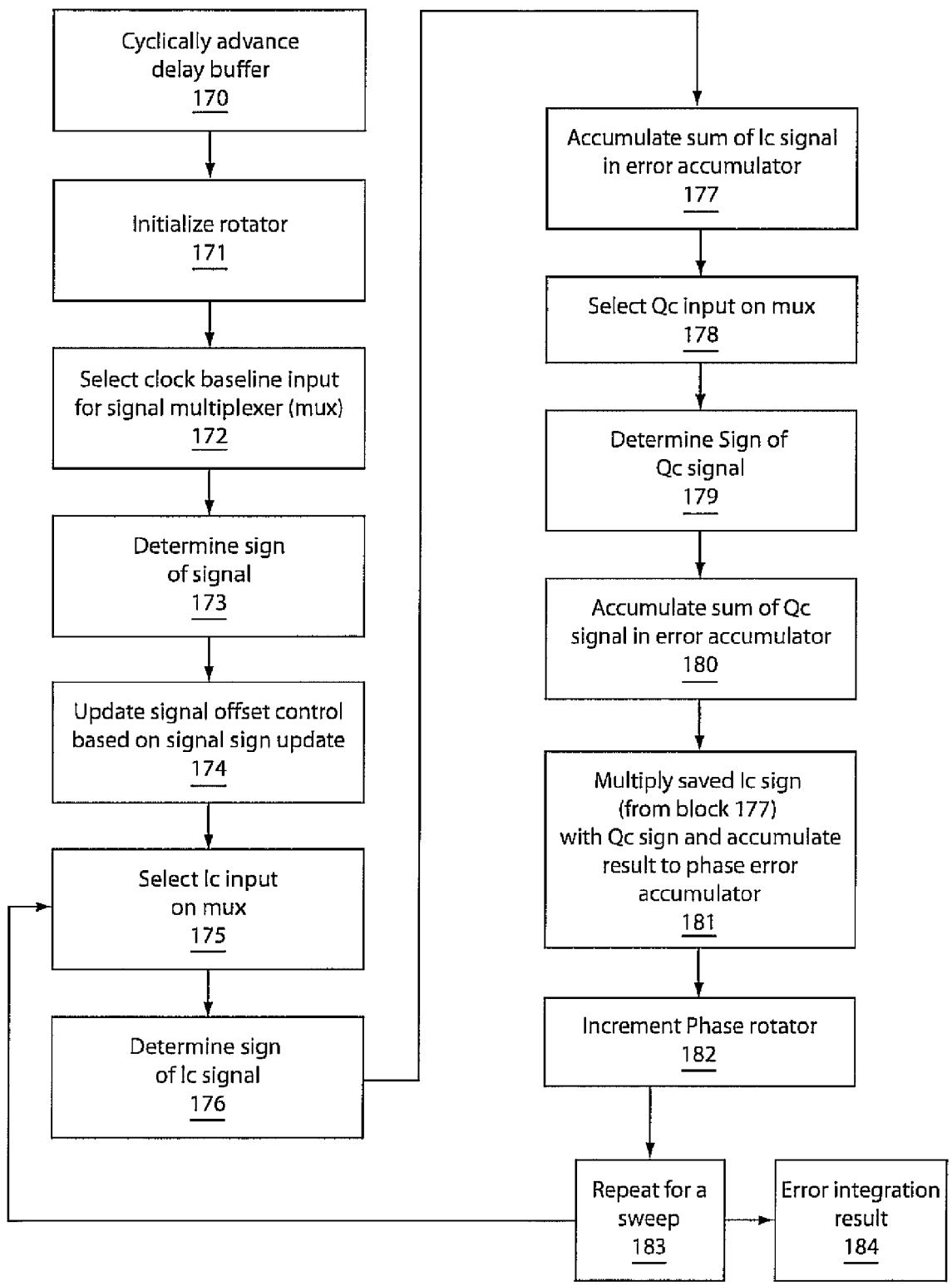
FIG. 6 is a block/flow diagram showing a clock correct method in accordance with one illustrative embodiment.

Referring to FIG. 6 with continued reference to FIG. 5, a method to determine error integration is illustratively depicted. In block 170, the clock delay buffer 161 is cyclically advanced one delay unit. In block 171, initialize a rotator 160 phase to 0. In block 172, select "0" or a clock baseline input of the signal multiplexer 156. In block 173, determine if the signal is >0, producing a waveform sign +1 or −1 In block 174, update signal offset control 158 based on the determination from block 173. In block 175, select the Ic waveform input of the signal multiplexer 156. In block 176, determine if the signal is >0, producing an Ic waveform sign +1 or −1. In block 177, accumulate the sum of the I sign value in an I_Duty_Error accumulator of module 163, save I sign. In block 178, select Qc waveform input of signal multiplexer 156. In block 179, determine if the signal is >0, producing a Qc waveform sign +1 or −1. In block 180, accumulate a sum of the Qc sign value in a Q_Duty_Error accumulator in module 163.

In block 181, multiply the saved I sign from block 177 by a Qc waveform polarity value, and accumulate a sum in an IQ_Error accumulator of module 163. In block 182, increment the phase rotator 160 one discrete phase step. In block 183, repeat blocks 175 through 182 until the phase rotator has completed a full 360 degree sweep or coverage of the full 2*T period of the Ic and Qc input clocks. This provides error integration for a predetermined period of operation.

Block 170 of the error measurement control method implements a variable time delay on a sign sample latch for each error determination sequence. For a clock correction method to properly function, the clock provided by the phase rotator 160 is delayed, or de-correlated, from the Ic and Qc clocks which are input to the phase rotator 160. This delay enables measurement of the Ic and Qc clock crossover times (or edges) at rotator phases which mix, or interpolate, both Ic and Qc information to determine the Ic and Qc clock edge crossover points. By providing the ability to measure the Ic and Qc waveform edges at interpolated rotator phase positions, it becomes possible for the measurement system to detect errors in the edge crossover times.

The rotator 160 phase adjustment is quantized to, say, approximately 5 degree digital steps in one embodiment (e.g., 64 discrete phase steps for a full 360 degree phase adjustment range results in a phase quantization of 5.625 degrees). This quantization can limit the accuracy with which the edge crossovers of the I and Q waveforms can be measured. By introducing a delay buffer 161 with programmable fine delay, the measurement system becomes capable of resolving edge crossovers to an accuracy better than the step resolution of the phase rotator itself.

In one embodiment, the variable time delay will advance delay in time steps of less than ½ of the time delay corresponding to one phase rotator step and provide both a minimum delay and delay range of at least 1/16 of a full 2*T clock period. In block 170, cyclically advancing the delay buffer means that the buffer delay is increased until the delay is at the maximum provided by the buffer, after which the programmed delay is wrapped to the minimum delay.

Blocks 172 through 174 in the error measurement control procedure define a DC offset correction process to remove any offsets in the signal measurement block 157. Uncompensated offsets in the signal measurement block 157 adds error to both the duty cycle and phase error determination. The DC offset correction process effectively adjusts a Signal_Offset control 158 such that an average signal measurement of 0 is obtained by the signal measurement block 157 when clock or signal multiplexer 156 is configured to select the "0" (clock baseline) input. This state is achieved by integrating the Signal_Offset control (158) in the opposite direction of the measured signal sign, thereby implementing an adapted DC offset compensation control loop.

The waveform sign determination performed in blocks 173, 176 and 179 in the error measurement control procedure is realized in one embodiment by averaging the results from at least 16 separate measurements to reduce the effect of noise on a single sign measurement result. If a majority of the 16 measurements are +1, a positive waveform value is determined; otherwise a negative waveform value is determined.

In an embodiment which employs a phase rotator 160 with 64 discrete phase positions, blocks 175 through 182 will be repeated 64 times to realize the following computations:

$$\text{PHASE\_IQ\_SUM} = \Sigma(\text{SGN}(Ic)*\text{SGN}(Qc)) \tag{10}$$

$$\text{DUTY\_I\_SUM} = \Sigma(\text{SGN}(Ic)) \tag{11}$$

$$\text{DUTY\_Q\_SUM} = \Sigma(\text{SGN}(Qc)) \tag{12}$$

The SGN( ) function in equations (10) through (12) outputs a 1 if the measured clock waveform is greater than a baseline (0) value and −1 if the waveform is less than or equal to the baseline value. In FIG. 5, the SGN( ) function is determined by signal measurement block 157, which determines if the measured waveform is greater than or equal to 0, corresponding to a SGN function value of 1, or <0, corresponding to a SGN function value of −1. Equations (10) through (12) all result in a value of 0 if the I and Q waveforms have 50% duty cycle and are in perfect quadrature.

After the error signals determined by equations (10) through (12) are computed by the error measurement control method of FIG. 6, the control variables PHASE_IQ 153, DUTY_I 154 and DUTY_Q 164 are updated using the following clock correction control procedure where the control signals are provided from the control module 163 and the clock correction control procedure is carried out by the clock correction circuit 160. Control module 163 and the clock correction control 160 preferably include logic circuits and devices (and/or software) to implement the following functionality in a clock correction control procedures.

Clock Correction Control Procedure:
1) If fast convergence mode, set ADJ to a value >1, otherwise set ADJ to 1
2) If DUTY_I_SUM>0, DUTY_I=DUTY_I−ADJ
3) If DUTY_I_SUM<0, DUTY_I=DUTY_I+ADJ
4) If DUTY_Q_SUM>0, DUTY_Q=DUTY_Q−ADJ
5) If DUTY_Q_SUM<0, DUTY_Q=DUTY_Q+ADJ
6) If PHASE_IQ_SUM>0, PHASE_IQ=PHASE_IQ+ADJ
7) If PHASE_IQ_SUM<0, PHASE_IQ=PHASE_IQ−ADJ Step 1) of the clock correction control procedure sets the convergence speed of the method. For fast convergence acquisition, the correction terms PHASE_IQ, DUTY_I, and DUTY_Q are updated rapidly (ADJ value >1) as a result of determined errors, while in non-acquisition (or tracking) mode, the terms are updated at a slower rate (ADI=1) to enable filtering of noise on the measured signal values.

Steps 2) through 5) of the clock correction control procedure modify the DUTY_I and DUTY_Q controls as a function of the DUTY_I_SUM and DUTY_Q_SUM error terms. The sign convention for duty cycle adjustment based on determined duty cycle error is chosen to lower the duty cycle error when the duty cycle adjustment is applied, and may change polarity depending on the implementation of a phase adjust method.

Steps 6) and 7) of the clock correction control procedure update the PHASE_IQ controls as a function of the PHASE_IQ_SUM error term. The sign convention for IQ quadrature adjustment based on determined quadrature error is chosen to lower the quadrature error (i.e. bring Q closer to 90 degrees delayed from I) when the correction is applied, and may change polarity depending on the implementation of a quadrature adjust method.

The control terms PHASE_IQ, DUTY_I and DUTY_Q in one embodiment are represented by integer register values which correspond directly to the hardware quadrature adjust and duty cycle adjust digital-to-analog converters (DACs) in the upper significant bits. The size of the registers within a logic state machine are made larger than the hardware DACs so that the registers can automatically average many measurements before hardware duty cycle or quadrature have to be updated.

In one embodiment, the registers have at least 4 bits of precision below the hardware DAC precision. As an example, if a hardware DAC had 5 bits of precision, a 9 bit accumulator would be used to represent the control value in the logic implementation, and a minimum of 16 successive measurements with ADJ=1 would be needed to affect the hardware adjustment.

Figure 4:
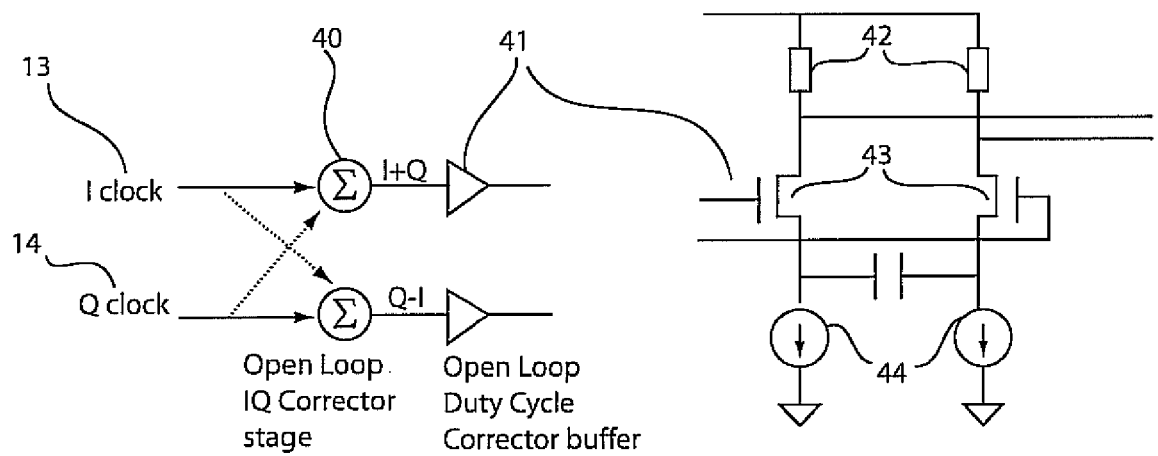
FIG. 4 is a block/schematic diagram showing an open loop CML quadrature clock correction system in accordance with the prior art.

An optional enhancement of the clock correction control procedure implements a control loop which balances the amplitude of the Ic and Qc output clocks which are distributed to the system phase rotators. Amplitude imbalance in these clocks may arise due to amplitude mismatch which can be introduced by a coarse phase correction stage 40 (FIG. 4) which may precede the described clock correction apparatus in some embodiments. In particular, the coarse correction buffer 40 can produce output signals with differing amplitude if the input signals to the buffer are not in quadrature.

Another source of amplitude mismatch arises due to differences in device match in the circuit realizations of the separate I and Q paths, including the devices and circuits used to realize clock correction buffer 150 (FIG. 5).

The amplitude mismatch of the Ic and Qc waveforms can be detected using the signal measurement block 157 to determine either the peak value of the selected Ic or Qc waveform or an average amplitude of the waveforms. Due to its simplicity, in a preferred embodiment, the peak value of the waveform may be determined using the following amplitude correction control procedure:

a) Select the Ic waveform input of clock/signal multiplexer 156.
b) Configure signal measurement block 157 to a lower signal gain state if necessary such that the block 157 can measure the peaks of the input clocks.
c) Initialize the Signal_Offset offset control value to the calibrated DC offset determined in the error integration procedure.
d) Initialize a rotator 160 phase to 0.
e) Determine if the signal is >0, producing a measurement result 1 or −1.
f) If measurement value is <0, increment the Signal_Offset control value and go to step e), otherwise proceed to step g). Also proceed to step g) if the Signal_Offset control value is at its maximum value.
g) Increment the phase rotator one step position.
h) Repeat steps e) through g) for a full 360 degree sweep (2*T time duration) of the phase rotator.
i) Save the Signal_Offset offset value to a temporary value PEAK_I
j) Select Qc waveform input of clock/signal multiplexer.
k) Repeat steps c) through h) to determine the peak value of the Qc waveform PEAK_Q.
l) If PEAK_I>PEAK_Q, increment a GAIN_Q control parameter if GAIN_Q is not at its maximum, otherwise decrement a GAIN_I control parameter
m) If PEAK_Q>PEAK_I, increment a GAIN_I control parameter if GAIN_I is not at its maximum, otherwise decrement a GAIN_Q control parameter Similar to the duty cycle and quadrature hardware adjustment controls, the Ic and Qc gain controls GAIN_I and GAIN_Q may be represented by register values which correspond to hardware DACs augmented with extra bits to implement measurement averaging. As an example, if 4 bit DACs are used to adjust the I and Q gain over a range from, e.g., 0.8 to 1.2 in steps of 0.025 in one embodiment, register values in control logic would be sized at 8 bits so that results from individual measurements of the peak values can be averaged. This averaging is desired to reduce noise in the measurement and avoid adjusting the Ic and Qc waveform gain controls based on noise.

In one illustrative embodiment, a control method for the quadrature clock correction includes a power-up reset initial clock alignment executed in a high loop bandwidth convergence mode (ADJ>1), followed by a period refresh of the correction thereafter executed in a low loop bandwidth tracking mode (ADJ=I). The low bandwidth periodic refresh compensates or tracks drifts in the DC offsets of the circuitry over temperature and voltage variations which may be experienced during extended operation of the system, thereby achieving improved quadrature clock accuracy over both process, voltage, and temperature variations. The improved quadrature clock accuracy, in turn, directly translates to reduced data sampling clock jitter in, e.g., a data receiver. Other hardware subsystems may also be employed.

A clock correction circuit or stage 150 (FIG. 1) may provide one or more of adjustment of the duty cycle of the Ic clock, Qc clock, the quadrature relationship of the Ic and Qc clocks, and the amplitude of the Ic clock and/or Qc clock. For the clock correction system 100 (FIG. 1) to function as desired, the clock correction stage 150 needs to provide enough adjustment range of the clock parameters to cover the expected manufacturing variation with sufficient resolution to achieve a desired maximum residual data clock sample jitter. In an illustrative embodiment, an IQ phase adjust range of at least +/−15 degrees, a duty cycle adjust range which covers a duty cycle error of at least 45:55 duty cycle (or 10% peak-peak duty cycle error), and an amplitude balance range of at least 1.2/0.8 (+/−20% amplitude mismatch) is desired. Other ranges are also contemplated. For example, a corresponding adjustment resolution of 1 degree phase error, 0.5% duty cycle error, and 2% amplitude match resolution may be employed in one embodiment.

Figure 7:
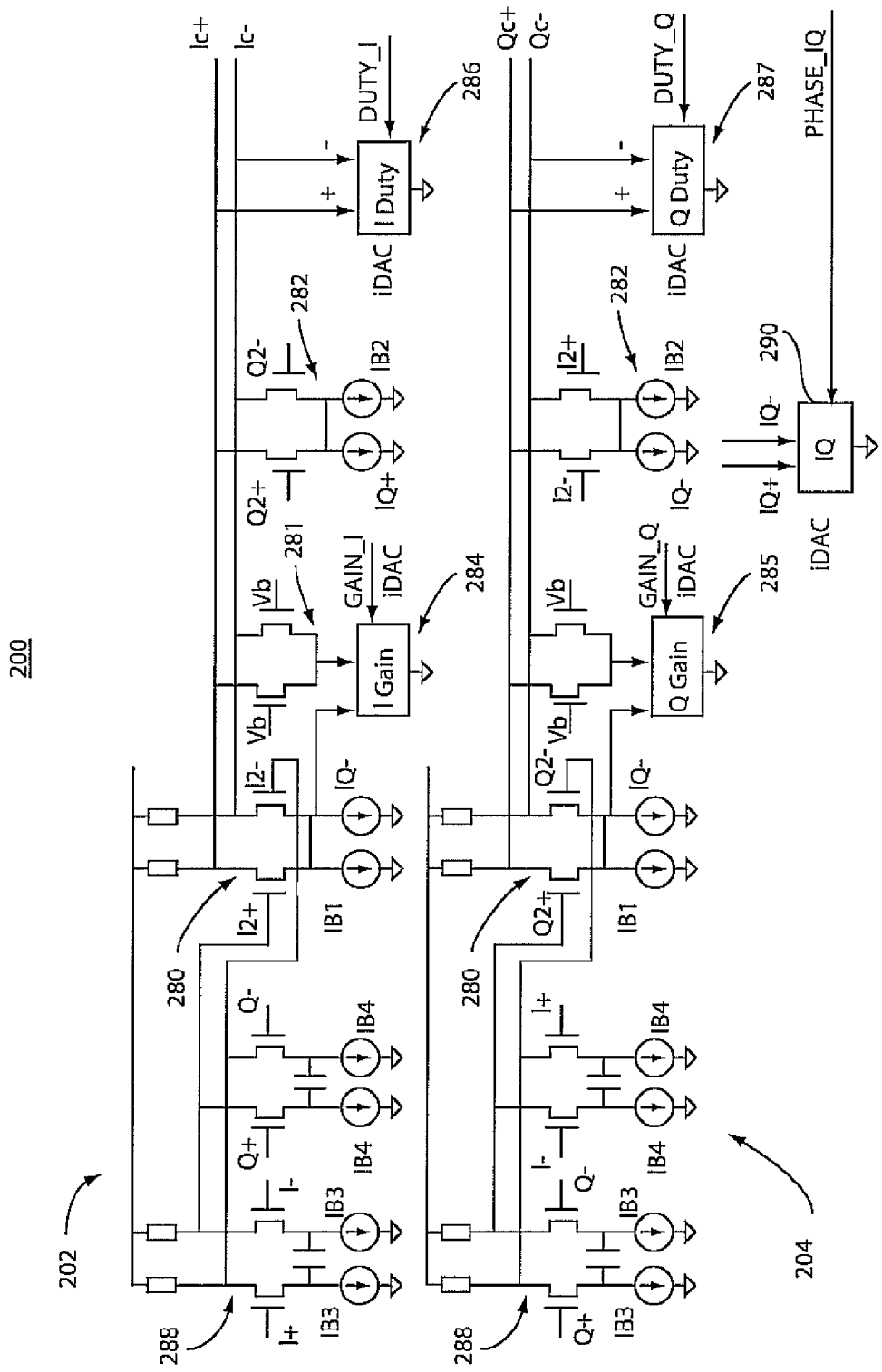
FIG. 7 is a schematic diagram showing circuitry for a clock correction device in accordance with the present principles.

Referring to FIG. 7, a schematic diagram of an illustrative current-mode logic (CML) clock correction buffer 200 is illustratively shown. The buffer 200 provides an "open loop" adjustment of the quadrature using a cascade of two CML mixers 202 and 204 which provide a nominal fixed I and Q delay of 45 degrees (e.g., for a I+Q/Q−I correction circuit). Realizing the 45 degree phase delay in two stages is an improvement over single-stage open-loop quadrature correction buffers, since with a single-stage circuit (Ic=I+Q,Qc=Q−I), a generally inappropriate signal shape is produced (with a flat portion near zero crossings that cause increased jitter and rotator nonlinearity). So simple spreading of the desired 45 degree delay over two stages instead of one yields substantial improvement in the shape and slew rate control of the output clock waveforms.

Bias current ratio IB4/IB3 controls the ratio of mixing in first stage clock buffers 288 and bias current ratio IB2/IB1 controls the ratio of mixing in second stage clock buffers 280 and 282. The quadrature relationship of the output clocks Ic (Ic+, Ic−) and Qc (Qc+, Qc−) in the clock correction stage 200 is adjusted by mixing a variable amount of Q2 signal onto the I2 clock output and I2 signal onto the Q2 clock output. Differential current DAC 290 is mirrored to tail currents in the CML buffers 280 and quadrature mix buffers 282.

The duty cycle of the corrected output clocks Ic and Qc is controlled by applying DC offsets to the output signals. As long as the CML clocks are conditioned by the clock buffer stages (first and second stages) to have a non-vanishing rise time through appropriate design and/or adjustment of load resistances and currents in the buffer stages, adjustment of the DC offset results in a proportional adjustment of the clock duty cycle. Differential current DACs 286 and 287 enable adjustment of the DC offset/duty cycle without changing the common-mode level of the output clocks. Similarly differential current DACs 284 and 285 enable adjustment of gain of the output clocks.

The amplitude of the output clocks Ic and Qc can be reduced by shifting bias current away from the input signal differential pairs in buffer stages 280 to zero-differential input signal stages 281. On an embodiment that instantiates an amplitude control loop, either the Ic or Qc clock is reduced to the level of the smaller of the two to result in balanced clock amplitudes.

In one embodiment, IQ adjustment and duty cycle adjustment result in roughly similar time resolution. This is preferential since it provides a similar loop gain for both the duty cycle and quadrature adjust feedback control loops, which is desired for optimum convergence of the feedback loops. The duty cycle and quadrature adjustment DACs may be designed so that they can be updated without adding a noise glitch to the clocks due to a change in the DAC code. Low-glitch DAC implementation techniques such as use of a track-and-hold circuit or thermometer-coded DAC are some techniques in the art which can be applied to realize a DAC capable of being updated without generating transient noise glitches on the output clocks Ic and Qc when updating the corresponding adjustment values.

Figure 8:
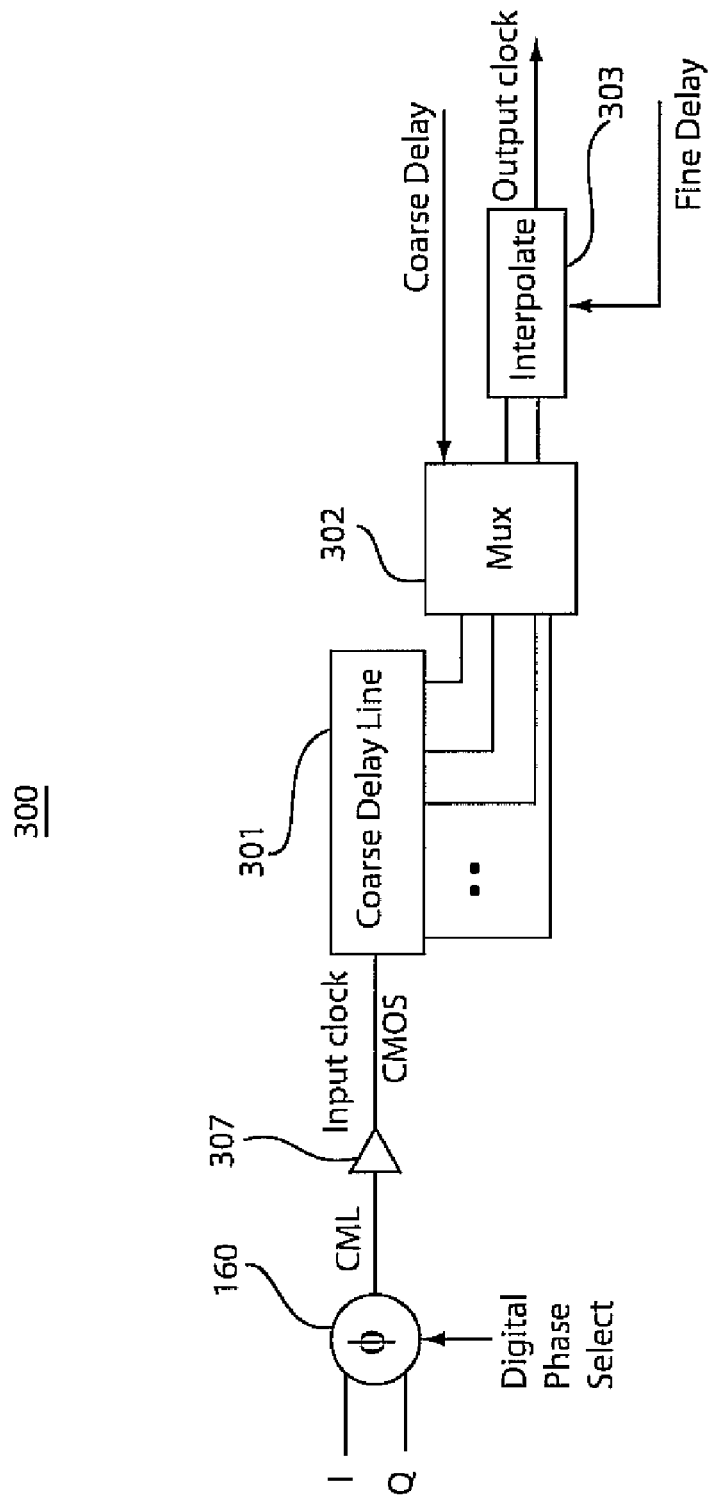
FIG. 8 is an illustrative variable time delay buffer which may be employed in accordance with the present principles.

Referring to FIG. 8, a time delay buffer 300 is illustratively depicted which may be implemented in accordance with the present principles. In an application for a data receiver system operating over a range of data rates from, e.g., approximately 3 to 12 Gb/s, the time delay buffer 300 is implemented using, e.g., a 100 ps CMOS delay line 301 which is coarse-tapped at various delay points and then interpolated to provide the needed time resolution. Phase rotator 160 which typically generates CML signals is converted to CMOS levels using a CML-to-CMOS conversion buffer 307. The output of the conversion buffer feeds a chain of CMOS inverters in coarse delay block 301. One implementation provides eight coarse delay steps with an average step size of approximately, e.g., 12 ps of delay each so that a delay coverage range of approximately 100 ps is provided. A multiplexer 302 selects an early and late delay from the coarse delay line 301 (which corresponds to, e.g., clock signals approximately 12 ps apart). A CMOS delay interpolator 303 is employed to interpolate these early and late delays into eight smaller steps, providing an adjustable delay resolution of approximately, e.g., 1.5 ps. The delay range and resolution of the delay line 301 is optimized to cover a desired minimum delay of T/16, a minimum span of T/16, and a minimum resolution of ½ the time delay corresponding to <1 phase rotator step. Alternate techniques may be used to generate the variable delay function as long as the desired minimum delay, range, and resolution are achieved.

Figure 9:
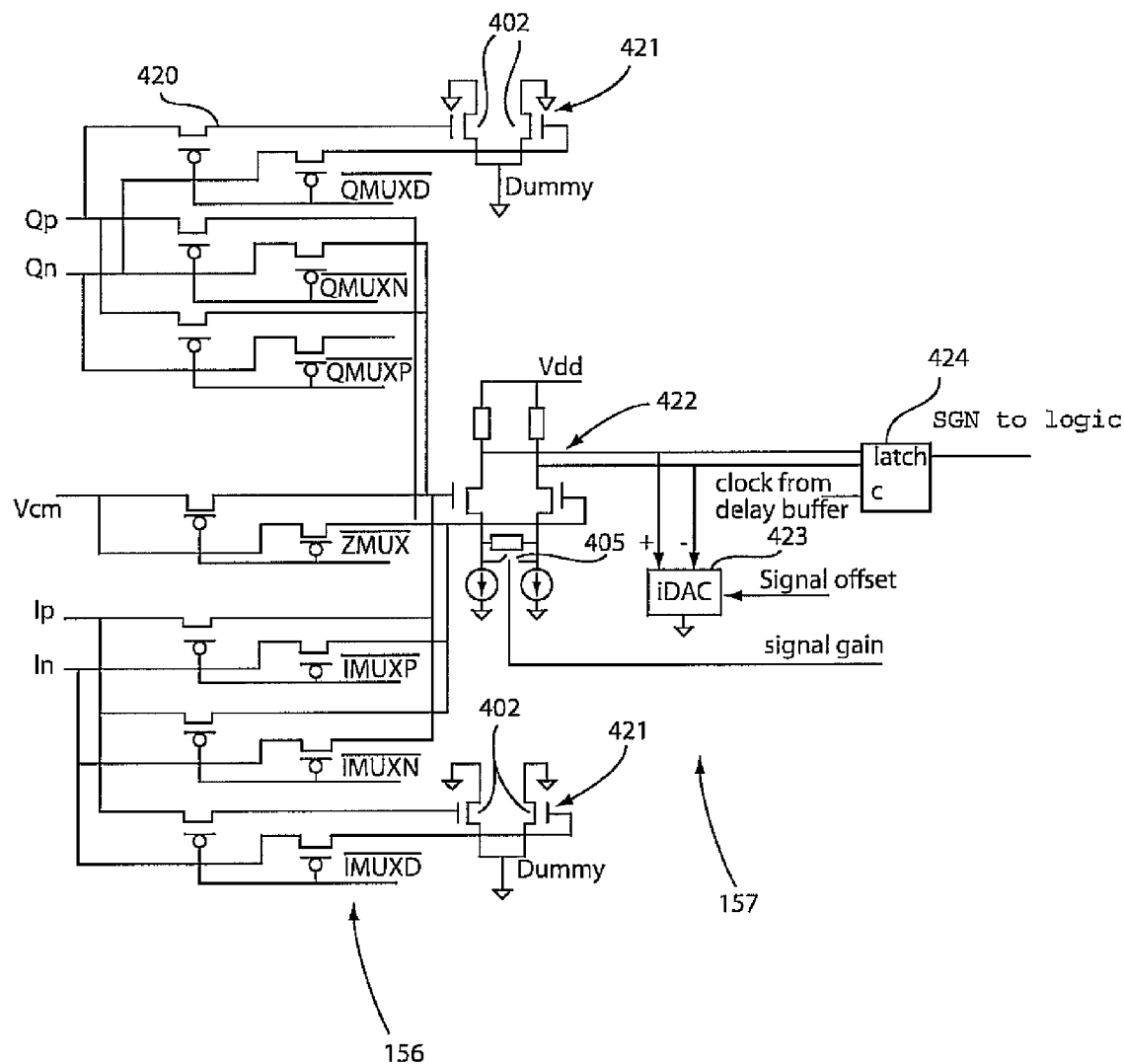
FIG. 9 is block/schematic diagram showing a clock/signal multiplexer and signal measurement system in accordance with one illustrative embodiment.

Referring to FIG. 9, the signal multiplexer 156 and signal measurement system 157 are depicted in greater detail. The signal multiplexer 156 provides routing of the Ic and Qc clocks to the signal measurement block 157. Because the same signal measurement block 157 is employed to measure both the Ic and Qc waveforms, as long as the signal multiplexer 156 provides a constant delay from Ic clock and Qc clock to the signal measurement block 157, it will introduce no quadrature error in the measurement/correction system 100 (FIG. 1).

The signal multiplexer 156 also inputs a clock baseline level, which corresponds to a differential CML voltage of 0 in an embodiment which employs CML Ic and Qc clocks. This clock baseline level is used to remove any DC offsets in the signal measurement block 157 which in turn could introduce error in the edge crossover measurements of the clock signals. The signal multiplexer 156 may also select an arbitrary number of other measurement signals besides Ic and Qc input clocks as shown in FIG. 5.

FIG. 9 shows a signal multiplexer 156 and signal measurement block 157 using CMOS circuitry. A passgate analog multiplexer structure 420 connects either differential I (Ip), differential −I (In), differential Q (Qp), differential −Q (Qn), or a nominal DC common-mode level Vcm (for CML I and Q clocks) of the I and Q signals to the input of a signal measurement offset null buffer. The complementary input clocks (I and Q) are multiplexed to improve the differential isolation of a selected Q clock leaking onto the input I clock and vice versa. As an example, if the I clock is shut off and the Q clock is turned on, leakage from Q+ and Q− are symmetrically balanced through off-state passgates to I+ and I−, thereby enabling reduction of the differential noise through the parasitic passage leakage.

Performance requirements for the clock multiplexer 120 include minimization of the differential delay between I and Q clock paths, the addition of no differential DC offset between I, Q, and clock baseline reference inputs, good isolation from the output to a non-selected path input, and presentation of as constant a load as possible to the input I and Q clocks. In particular, in Ic measurement, Qc measurement, and clock baseline measurement configuration, a similar load should be presented to the Ic and Qc lines by a passgate multiplexer. This can be achieved by adding passgates (transistors 402) which connect Ic or Qc to a dummy "offset null" buffer 421 when it is not connected to the real offset null buffer 422 to provide the same capacitive load to the clock lines independent of a clock multiplexer 420 configuration.

The multiplexer design provides minimal glitching on the Ic and Qc clocks when re-configuring the multiplexer 420 or sampling the selected signal. The clock multiplexer 420 minimizes glitching on the clock lines from multiplexer control lines (e.g., QMUX, ZMUX and IMUX) since the complementary control lines produce opposite polarity noise coupling through passgate devices 404 to the clock signals, enabling differential cancellation of the switching noise. In other embodiments, the multiplexer re-configuration lines may be updated at a synchronous phase offset from edges on either the Ic clock or Qc clock so that any noise glitches happen away from the clock edges.

A signal measurement function (157) is implemented by a combination of an offset buffer 422, offset DAC 423, and a decision latch 424. Offset buffer 422 provides the function of enabling a calibrated DC offset to be added to the signal waveform to cancel offsets in the latch 424 decision device. The offset buffer 422 also provides reverse-isolation to the selected multiplexer input from latch "kickback" or noise which can happen when the latch 424 is clocked. Offset DAC 423 provides sufficient range to compensate expected offsets in the analog circuitry. An optional gain adjustment (Signal_gain) may be added to offset buffer 422 to increase its ability to measure a larger amplitude of input signals while minimizing the needed range of the offset DAC 423. In the example embodiment of FIG. 9, offset buffer 422 is set to a low gain state by opening a shorting switch 405 which introduces resistive de-generation in the stage, thereby lowering its gain. In one embodiment, the offset buffer 422 is set to high gain when measuring waveform edges and low gain when optionally measuring waveform peaks or amplitudes.

Latch 424 is preferably a binary decision device constructed using known techniques, such as a differential cascade voltage switch (DCVS) latch structure. A control method updates the Signal_offset level to drive the latch 424 to a "metastable" state where it outputs an equal number of 1 and 0 outputs to determine a measured input waveform level. This measurement technique is known in the art and enables determination of an analog control voltage with an efficient 1-bit A/D detection device. If only the sign of a measured signal is needed, the Signal_offset control value to the offset DAC 423 is configured to an adapted offset and the latch 424 directly outputs a 1 to indicate the signal is >0 and 0 otherwise.

Having described preferred embodiments of a system and method for dynamic quadrature clock correction for a phase rotator system (which are intended to be illustrative and not limiting), it is noted that modifications and variations can be made by persons skilled in the art in light of the above teachings. It is therefore to be understood that changes may be made in the particular embodiments disclosed which are with the scope and spirit of the invention as outlined by the appended claims. Having thus described aspects of the invention, with the details and particularity required by the patent laws, what is claimed and desired protected by Letters Patent is set forth in the appended claims.

What is claimed:

1. A method for closed loop clock correction, comprising:
    adjusting two or more input signals comprising at least one in-phase clock and one quadrature clock;
    applying adjusted quadrature clock signals to a device capable of generating a 4-quadrant interpolated output clock phase;
    delaying an interpolated output clock phase to form a clock for a measurement device;
    measuring two or more adjusted input signals to the measurement device over a range of interpolated output clock phases;
    determining error on the in-phase clock and the quadrature clock using sampled information from the measurement device; and
    adapting the in-phase clock and the quadrature clock using determined error information in a closed loop feedback configuration.

2. The method as recited in claim 1, wherein corrected in-phase and quadrature clocks are distributed to at least one of a phase interpolator device, and a quadrature mixer device in a radio system.

3. The method as recited in claim 1, further comprising distributing corrected in-phase and quadrature clocks to a phase interpolator device in a data receiver or transmitter system.

4. The method as recited in claim 1, further comprising performing an automatic offset calibration of the measurement device.

5. The method as recited in claim 1, wherein delaying includes adjusting a delay of an interpolated clock for sequential signal measurements.

6. The method as recited in claim 1, wherein adapting includes performing an adaptive quadrature alignment process including dynamically and automatically adjusting a quadrature relationship of the in-phase and quadrature clock signals.

7. The method as recited in claim 1, wherein adapting includes performing an adaptive duty cycle alignment process including dynamically and automatically adjusting a duty cycle of the in-phase and quadrature clock signals.

8. The method as recited in claim 1, wherein adapting includes performing an adaptive amplitude alignment process including dynamically and automatically adjusting an amplitude of the in-phase and quadrature clock signals.

9. The method as recited in claim 1, wherein corrected in-phase and quadrature clocks are distributed to one or more quadrature mixer devices in a radio receiver system.

10. The method as recited in claim 1, wherein signals other than the in-phase clock and the quadrature clock are sampled and dynamically adapted after the in-phase clock and the quadrature clock are fully calibrated.

11. A computer readable medium comprising a computer readable program, wherein the computer readable program when executed on a computer causes the computer to perform the steps as recited in claim 1.

12. A method for dynamically correcting a clock in a closed loop quadrature clock please generation system, comprising:
    receiving two or more input signals comprising in-phase and quadrature clocks;
    adjusting the in-phase clock and the quadrature clock for at least one of quadrature, duty cycle, and amplitude;
    applying adjusted quadrature clock signals to a rotator capable of generating a 4-quadrant interpolated output clock phase;
    delaying an interpolated output clock phase to form a clock for a measurement device;
    measuring two or more adjusted input signals including the in-phase and quadrature clocks over a range of interpolated output clock phases in the measurement device;
    determining error information including duty cycle error, quadrature error, and amplitude error on the in-phase and quadrature clocks using sampled information from the measurement device; and
    adapting the quadrature, duty cycle, and amplitude adjustments on the in-phase and quadrature clocks using the error information in a closed loop feedback configuration.

13. The method as recited in claim 12, further comprising performing an automatic offset calibration on the measurement device.

14. The method as recited in claim 12, further comprising adjusting delay of an interpolated clock from the rotator to provide sequential signal measurements.

15. The method as recited in claim 12, further comprising distributing corrected in-phase and quadrature clocks to a phase interpolator device in a data receiver or transmitter system.

16. The method as recited in claim 12, further comprising performing an adaptive quadrature alignment process including one or more of dynamically and automatically adjusting a quadrature relationship of the in-phase and quadrature clocks, dynamically and automatically adjusting the duty cycle of the in-phase and quadrature clocks and dynamically and automatically adjusting the amplitude of the in-phase and quadrature clocks.

17. The method as recited of claim 12, wherein corrected in-phase and quadrature clocks are distributed to one or more mixer devices in a system.

18. The method as recited of claim 12, wherein another signal other than the in-phase and quadrature clocks is sampled and dynamically adapted after the in-phase and quadrature clocks are fully calibrated.

19. An apparatus for adapting a closed loop clock correction control system in a quadrature clock phase generation system, comprising:
 a clock correction device configured to receive two or more input signals comprising in-phase and quadrature clocks, the clock correction device configured to adjust the in-phase and quadrature clocks in accordance with closed loop feedback from a control module which provides for correction of at least one of quadrature, duty cycle, and amplitude;
 a rotator coupled to the clock correction device and configured to adjust quadrature clock signals to generate a 4-quadrant interpolated output clock phase;
 a delay coupled to the rotator to receive the interpolated output clock phase to form a clock for a measurement device;
 the measurement device receives adjusted in-phase and quadrature clocks over a range of interpolated output clock phases to determining duty cycle error, quadrature error, and amplitude error on the in-phase and quadrature clocks using sampled information; and
 the control module configured to receive an output of the measurement device and adapt the quadrature error, duty cycle error, and amplitude error to provide adjustments to the in-phase and quadrature clocks at the clock correction device using error information.

20. The apparatus as recited in claim 19, wherein the apparatus includes one of a phase interpolator device, and a quadrature mixer device in a radio transmitter or receiver system.

21. The apparatus as recited in claim 19, further comprising a delay element configured to adjust the delay of an interpolated clock for sequential signal measurements.

22. The apparatus as recited in claim 19, wherein the clock correction device performs an adaptive quadrature alignment process to at least one of:
 dynamically and automatically adjust a quadrature relationship, dynamically and automatically adjust a duty cycle and dynamically and automatically adjust an amplitude of the in-phase and quadrature clock signals.

23. The apparatus as recited in claim 19, wherein corrected in-phase and quadrature clocks are distributed to least one of quadrature mixer device and a phase interpolator device.

24. The apparatus as recited in claim 19, wherein a signal other than the in-phase and quadrature clocks is sampled and dynamically adapted after the in-phase and quadrature clocks are calibrated.

\* \* \* \* \*